Nov. 14, 1967 P. SCHUCHT 3,353,126

RESONANT CIRCUIT TUNABLE OVER A LARGE FREQUENCY RANGE

Original Filed Sept. 1, 1964 2 Sheets-Sheet 1

United States Patent Office 3,353,126

Patented Nov. 14, 1967

3,353,126

RESONANT CIRCUIT TUNABLE OVER A LARGE FREQUENCY RANGE

Peter Schucht, Munich, Germany, assignor to Siemens Aktiengesellschaft, Berlin and Munich, Germany, a corporation of Germany Continuation of application Ser. No. 393,643, Sept. 1, 1964. This application Oct. 31, 1966, Ser. No. 591,024
Claims priority, application Germany, Sept. 3, 1963, S 87,070
1 Claim. (Cl. 334—78)

ABSTRACT OF THE DISCLOSURE

A resonant circuit formed of a pair of inductances connected in series, two variable capacitances connected in series, the respective series circuits being connected in parallel, and a coupling capacitance connected between the junction point of the inductances and the junction point of the two variable capacitances. One of the variable capacitances has a value which permits selection of partial ranges of the total frequency range, and the other of the variable capacitances has a value for permitting fine tuning within the respective partial range. The coupling capacitance has a value such that capacitance changes of the fine tuning capacitance will effect equally great frequency changes in each partial range.

This application is a continuation of application Ser. No. 393,643, filed Sept. 1, 1964, and now abandoned.

The invention relates generally to oscillator circuits and more particularly to oscillator circuits operating over a large frequency range, wherein it is possible to so switch to partial frequency ranges that the tuning in all of the partial ranges can be accomplished with a variable capacitance to provide a corresponding frequency spread for each range.

According to the invention this is accomplished with very low expenditure by constructing the oscillatory circuit of the oscillator in a form wherein the components are connected similarly to a bridge circuit, the operation of which, however, differs from the usual balanced bridge. The components will, however, be designated in corresponding manner in view of the physical arrangement thereof. Thus, respective bridge branches are formed by two inductances and two capacitances, of which one capacitance serves for the selection and adjustment of the partial ranges within the total frequency range and the other capacitance serves for the fine adjustment within the respective ranges, and in the bridge diagonal between the connecting point of the two inductances and of the capacitances there is disposed a coupling capacitance through the dimensioning of which like capacitance changes of the fine adjustment in all ranges will produce a like frequency change.

The coupling capacitance in the bridge diagonal has the effect of a frequency-dependent capacitance which brings about, in the upper part of the frequency range an increase and in the lower part of the frequency range a decrease of the frequency variation of the capacitance for the fine tuning. There is achieved thereby in all tuning ranges, through equal fine tuning capacitance changes, equally great frequency variations.

The frequency spread of the partial ranges is determined by the capacitance variation for the fine tuning, and the frequency position of these partial ranges in the total frequency range is determined by the capacitance in the other bridge branch.

Further details of the invention are described with the aid of the drawings, wherein.

Figure 1:
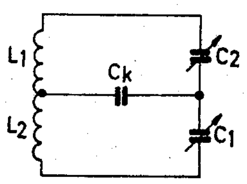
FIG. 1 illustrates, in principle, an oscillator circuit constructed in the manner of a bridge circuit.

The oscillator bridge-like circuit according to FIG. 1, consists of the bridge branches $L_1$, $L_2$, $C_1$ and $C_2$, and a bridge diagonal formed by the coupling capacitance $C_k$. The two inductances $L_1$ and $L_2$ may be formed, for example, by a coil tap on the oscillatory circuit inductance. The capacitances $C_1$ and $C_2$ may be constructed, for example, as rotary variable condensers. One of the capacitances $C_1$ and $C_2$ serves, for example, for the subdivision of the whole frequency range into any desired number of equal-sized partial frequency ranges succeeding one another without gaps, while the other capacitance can be so determined that through its variation the fine tuning is achieved in each individual partial range. In the adjustable oscillatory circuit it is possible, for example, for the capacitance $C_1$ for the range selection to be formed of selectively connectable fixed capacitances. Likewise it is possible to create different capacitance values of $C_1$ electronically by means of voltage-controlled reactances, as, for example in the case of capacitance diodes, through variations in the negative bias voltage.

The use of the bridge-like circuit is not restricted to oscillators with a subdivided frequency range. If for the capacitance $C_1$ there is used a continuously variable condenser which can sweep the entire frequency range of an oscillator, when with a similarly continuously variable condenser is employed for the capacitance $C_2$ there can be achieved at every point in the frequency range an equally great frequency variation, or spread the magnitude of such frequency variation depending on the maximum and minimum adjustable values of the capacitance $C_2$. Through change in the capacity $C_1$ for the range setting a frequency position may be established in the environment of which it is possible to effect a fine tuning through change in the capacitance $C_2$ in the other bridge branch. The magnitude of the capacitance variation for the fine tuning is then not limited to a certain value, but is freely selectable.

Figure 2:
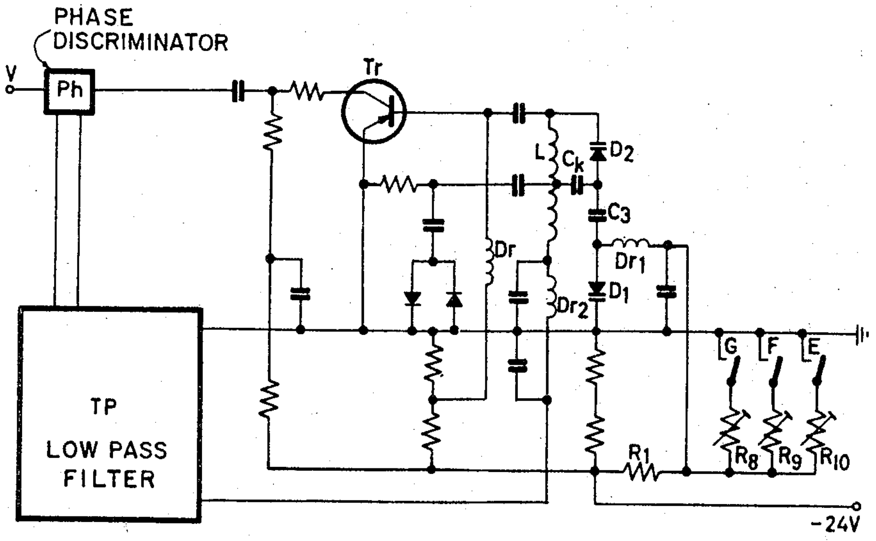
FIG. 2 illustrates a practical example of the invention incorporating frequency regulation.

A further advantageous use of the bridge-like circuit exists in the case of frequency-regulated oscillators. FIG. 2 illustrates a frequency-regulated oscillator selectively adjustable to three tuning ranges. The tuning range of a frequency-regulated oscillator, for, say, 70 to 100 megacycles may be subdivided, preferably into three equally extensive partial ranges of 70 to 80 megacycles, 80 to 90 megacycles and 90 to 100 megacycles. The oscillator circuit consists of the oscillatory transistor $T_r$ and an oscillatory circuit, formed as a bridge circuit with the inductance L which is provided with a coil tap and with the voltage-regulated capacitance diodes $D_1$ and $D_2$. To the capacitance diode $D_2$ there is supplied from the phase discriminator P*h*, over the low pass TP and the regulating line, the regulating voltage for the control of its capacitance value, and thereby for the fine tuning of the oscillator. At the two inputs of the phase discriminator P*h* there is supplied the oscillator frequency and the reference frequency (input V). The selective tuning of the individual partial ranges is accomplished through adjustment of the bias voltage on the capacitance diode $D_1$.

The dimensioning of the bridge-like circuit is such that in the middle tuning range (80 to 90 megacycles) the capacitances $D_1$ and $D_2$ ($C_1$, $C_2$, FIG. 1) are about equal. In this range the bridge circuit is balanced (bridge zero point) and the coupling capacitance $C_k$ is practically without influence. In the high tuning range (90 to 100 megacycles) this bridge zero point lies at the upper end of the range. Upon change in the capacity of the diode $D_2$ toward greater capacitances there takes place, in an increasing degree, a detuning of the bridge circuit and the coupling capacitance $C_k$ is likewise increasingly effective in the tuned circuit, so that with equal bias voltage on the diode $D_2$, a greater frequency variation is achieved than without coupling capacitance $C_k$. In the low tuning range (70 to 80 megacycles) the frequency variation of the diode $D_2$ must be reduced. The bridge equilibrium lies on the lower range end and with decreasing capacitance of the diode $D_2$ the influence of the coupling capacitance becomes increasingly greater and brings about the desired reduction of the frequency variation. Through suitable choice of the size of the coupling capacitance, a like frequency variation can be achieved with good precision in all three tuning ranges at equal capacitance variation (equal regulating voltages).

Figure 3:
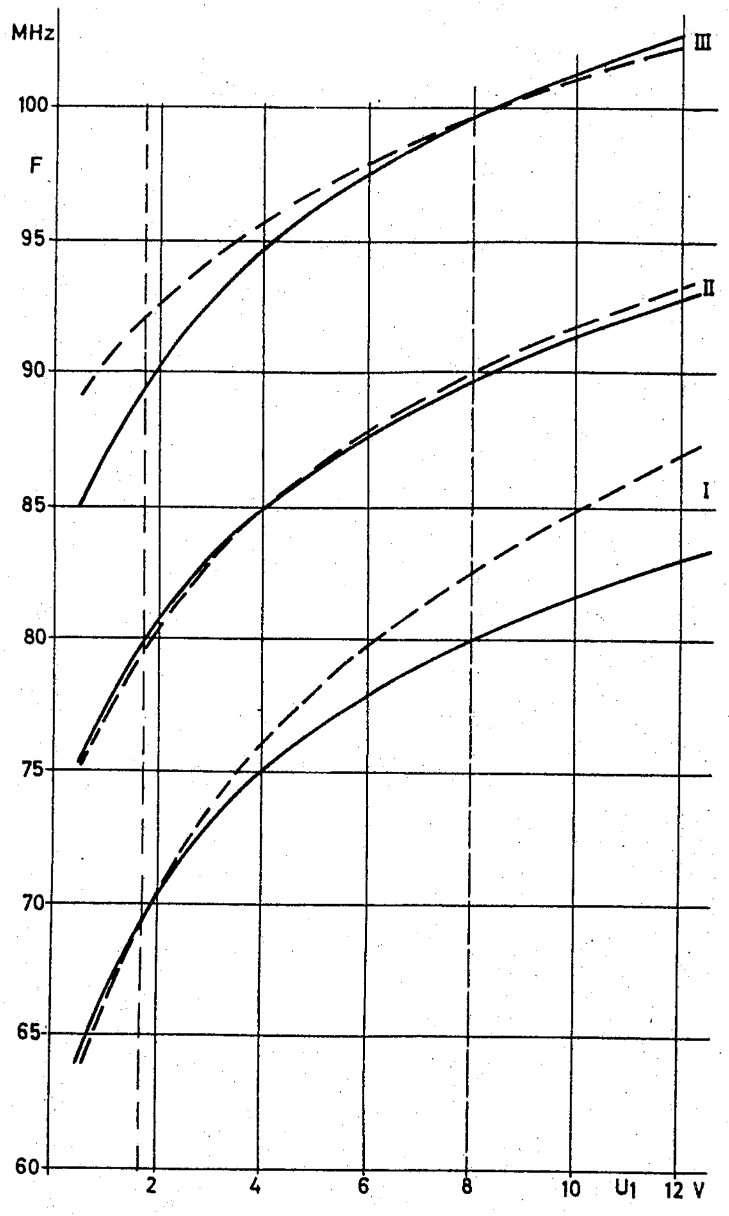
FIG. 3 illustrates the frequency regulating range in the three tuning ranges of the embodiment of the invention according to FIG. 2, taking into account the influence of the coupling capacitance in the bridge diagonal.

In FIG. 3 the frequency F of the oscillator is plotted in dependence upon the regulating voltage $U_1$ for the capacitance diode $D_2$ for the three tuning ranges I (70 to 80 megacycles), II (80 to 90 megacycles) and III (90 to 100 megacycles). The solid curves represent the frequency variation with coupling capacitance $C_k$ connected in the circuit, and the curves in broken lines show the variation in the absence of the coupling capacitance. The influence of the coupling capacitance thereby becomes clearly visible. In the regulating range from about 2 to 8 v. there is achieved in all three tuning ranges I, II and III exactly the same frequency change of 10 megacycles. At a given regulating voltage without the coupling capacitance, in the lower range I the achievable frequency change is too great, while in the upper range III it is too small.

The capacitance values permanently allocated to the partial ranges may be generated by different values of bias voltage on the capacitance diode $D_1$, which result through the closure of one of the contacts E, F, G the respective relatively large resistances $R_8$, $R_9$ and $R_{10}$ cause a correspondingly large drop across resistor $R_1$.

The diode $D_2$ can be similarly biased as is diode $D_1$. The use of voltage-controlled capacitance diodes in both bridge branches requires an uncoupling of the direct voltage control circuits, in view of which, between the two capacitance diodes $D_1$ and $D_2$ connected in series, there is provided an uncoupling condenser $C_3$, whose capacity is great as compared to the maximum capacity of the capacitance diodes $D_1$ and $D_2$.

Changes may be made within the scope and spirit of the appended claim which defines what is believed to be new and desired to have protected by Letters Patent.

The invention claimed is:

A resonant circuit with a large frequency range subdivisible into partial ranges, comprising a bridge-like circuit including two inductances connected in series and two independently variable capacitances connected in series, the respective series circuits being connected in parallel, and a coupling capacitance connected between the junction point of said inductances and the junction point of said two variable capacitances, one of said variable capacitances serving for determination of relatively large partial ranges of the total frequency range, and the other of said variable capacitances serving for fine tuning within the respective partial ranges, said variable capacitors being dimensioned to be of approximately equal value in the middle of said frequency range to form a balanced bridge, said coupling capacitance having a capacity such that capacitance changes of said other variable capacitance will effect an equally great frequency change in each partial range.

References Cited

UNITED STATES PATENTS 3,020,493 2/1962 Carroll ---------- 332—30 XR

FOREIGN PATENTS 762,743 12/1956 Great Britain.

1,319,107 1/1963 France.

ROY LAKE, *Primary Examiner.*

S. H. GRIMM, *Examiner.*